(12) United States Patent
Choi et al.

(10) Patent No.: US 9,709,903 B2
(45) Date of Patent: Jul. 18, 2017

(54) OVERLAY TARGET GEOMETRY FOR MEASURING MULTIPLE PITCHES

(75) Inventors: DongSub Choi, Yongin (KR); David Tien, Santa Clara, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 13/446,133

(22) Filed: Apr. 13, 2012

(65) Prior Publication Data

US 2013/0107259 A1    May 2, 2013

Related U.S. Application Data

(60) Provisional application No. 61/554,104, filed on Nov. 1, 2011.

(51) Int. Cl.
*G01B 11/00*    (2006.01)
*G03F 7/20*    (2006.01)

(52) U.S. Cl.
CPC ...... *G03F 7/70683* (2013.01); *G03F 7/70633* (2013.01)

(58) Field of Classification Search
CPC . G01B 11/00; G01B 11/06; G01J 4/00; G03F 9/00; G01N 23/04
USPC ............ 356/366, 401, 237.1; 250/307
See application file for complete search history.

(56) References Cited

U.S. PATENT DOCUMENTS

| 7,671,990 B1* | 3/2010 | Adel ............... G03F 7/70683 356/400 |
| 2001/0019407 A1* | 9/2001 | Sato et al. .............. 356/237.4 |
| 2003/0059685 A1* | 3/2003 | Ohsaka ....................... 430/5 |
| 2004/0233441 A1 | 11/2004 | Mieher et al. |
| 2004/0246482 A1 | 12/2004 | Sezginer et al. |
| 2010/0190096 A1 | 7/2010 | Ausschnitt et al. |
| 2012/0033215 A1* | 2/2012 | Kandel et al. ............ 356/366 |
| 2013/0032712 A1* | 2/2013 | Shih .................... G01N 23/04 250/307 |

FOREIGN PATENT DOCUMENTS

TW    201034052 A1    9/2010

\* cited by examiner

*Primary Examiner* — Tarifur Chowdhury
*Assistant Examiner* — Jamil Ahmed
(74) *Attorney, Agent, or Firm* — Suiter Swantz pc llo

(57) ABSTRACT

An overlay target for use in imaging based metrology is disclosed. The overlay target includes a plurality of target structures including three or more target structures, each target structure including a set of two or more pattern elements, wherein the target structures are configured to provide metrology information pertaining to different pitches, different coverage ratios, and linearity. Pattern elements may be separated from adjacent pattern elements by non-uniform distance; pattern elements may have non-uniform width; or pattern elements may be designed to demonstrate a specific offset as compared to pattern elements in a different layer.

18 Claims, 15 Drawing Sheets

OVERLAY TARGET GEOMETRY FOR MEASURING MULTIPLE PITCHES

PRIORITY

The present application claims the benefit under 35 U.S.C. §119(e) of U.S. Provisional Application Ser. No. 61/554,104, filed Nov. 1, 2011, which is incorporated herein by reference.

FIELD OF THE INVENTION

The present invention is directed generally toward overlay targets for semiconductor metrology, and more particularly toward overlay targets in semiconductors utilizing multiple pitches.

BACKGROUND OF THE INVENTION

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). The structures may take the form of gratings, and these gratings may be periodic. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of semiconductor integrated circuit manufacturing. Conventionally, understanding of the variation across die and wafer are limited to the fixed sampling and hence overlay error is detected only for the known selected sites.

FIG. 1 illustrates a typical overlay target of the prior art. FIG. 1 illustrates an overlay target having 180 degree and 90 degree rotational symmetry, respectively, about a center of symmetry. The target structures 102, 106 of FIG. 1 include pattern elements 104, 108, which are positioned periodically with a fixed pitch between pattern elements 104, 108 within each target structure 102, 106.

Moreover, if a measured characteristic, such as overlay error, of the wafer is unacceptable (e.g., out of a predetermined range for the characteristic), the measurement of the one or more characteristics may be used to alter one or more parameters of the process such that additional wafers manufactured by the process have acceptable characteristics.

In the case of overlay error, an overlay measurement may be used to correct a lithography process in order to keep overlay errors within desired limits. For example, overlay measurements may be fed into an analysis routine that calculates "correctables" and other statistics, which may be used by the operator in order to better align the lithography tool used in the wafer processing.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images. Such overlay metrology targets (or 'marks') generally comprise features formed in two layers, the features configured to enable measurement of spatial displacement between features of the layers (i.e., the overlay or displacement between layers).

There are, however, a number of disadvantages to using metrology processes and tools to measure one or more characteristics of a wafer for process monitoring and control applications. For example, contemporary semiconductor devices include elements having different center-to-center distances (pitch). An overlay calibrated to align elements having a certain pitch may be ineffective to align elements having a different pitch. Using metrology measurements acquired with an overlay calibrated for a certain pitch may not provide sufficient information about the characteristic(s) of the wafers such that the process can be accurately monitored and controlled.

Consequently, it may be desirable to provide a method and system which provide alignment information useful for a variety of device pitches, allowing for more accurate measurements of a selected wafer to provide adequate correctable information.

SUMMARY OF THE INVENTION

Accordingly, the present invention is directed to a novel method and apparatus for providing alignment information useful for a variety of device pitches, allowing for more accurate measurements of a selected wafer to provide adequate correctable information.

An overlay target for use in imaging based metrology is disclosed. In one aspect, the overlay target may include, but is not limited to, a plurality of target structures, each target structure including a set of three or more pattern elements, wherein each of the three or more pattern elements are separated by a non-uniform distance defining two or more different pitches.

In another aspect, the overlay target may include, but is not limited to, a plurality of target structures, each target structure including a set of two or more pattern elements of non-uniform width. Each target structure provides information pertaining to a coverage ratio in a lithographic process.

In another aspect, the overlay target may include, but is not limited to, a plurality of target structures, each target structure including at least two sets of two or more pattern elements. A first set of pattern elements have uniform width and define a uniform pitch; a second set of pattern elements have a different uniform width and define a different uniform pitch.

In another aspect, the overlay target may include, but is not limited to, a plurality of target structures, each target structure including at least two sets of two or more pattern elements. The pattern elements of a first target structure define a pitch such that the pattern elements of the first target structure are offset by a non-uniform distance as compared to the pattern elements of a second target structure.

An apparatus suitable for contrast enhancement of an overlay metrology target is disclosed. In one aspect, the apparatus may include, but is not limited to, an illumination source; a first polarizer configured to polarize at least a portion of light emanating from the illumination source; a beam splitter configured to direct a first portion of light processed by the first polarizer along an object path to a surface of one or more specimens and a second portion of light processed by the first polarizer along a reference path; a detector disposed along a primary optical axis, wherein the detector is configured to collect a portion of light reflected from the surface of the one or more specimens; and a second polarizer configured to analyze at least a portion of light reflected from the surface of the one or more specimens prior to the light impinging on the image plane of the detector, wherein the first polarizer and the second polarizer are arranged to minimize the amount of light reflected from unpatterned portions of the one or more specimens reaching the detector.

In another aspect, the apparatus may include, but is not limited to, an illumination source; a detector disposed along a primary optical axis, wherein the detector is configured to collect a portion of light reflected from a surface of the one or more specimens; an aperture positioned at a pupil plane of an illumination path, wherein the aperture is configured to select an illumination angle of illumination emanating from the illumination source, wherein the illumination angle is suitable for achieving a selected contrast level at an imaging plane of the detector; and a first beam splitter configured to direct a first portion of light transmitted through the aperture along an object path to a surface of one or more specimens and a second portion of light transmitted through the aperture along a reference path.

A method suitable for using an overlay target to align semiconductor elements in a semiconductor wafer fabrication process having semiconductor elements with different pitches. Alignment information between two layers in a semiconductor fabrication process is derived by detecting patterns elements in a first layer and pattern elements in a second layer where the pattern elements in the second layer define non-uniform pitches. Alignment information may be used to adjust the deposition of semiconductor components.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Referring generally to FIG. 2 through FIG. 7, an overlay target suitable for imaging based overlay metrology is described in accordance with the present disclosure. In a general sense, the overlay targets of the present invention may be used to determine overlay error between two successive process layers of a semiconductor wafer. For example, an overlay target may be utilized to measure the alignment of a first semiconductor layer with respect to a second semiconductor layer, where the second layer and the first layer are disposed successively. Additionally, an overlay target may be used to determine alignment error between two structures formed on a common semiconductor layer via two or more different processes (e.g., lithographic exposures). For example, an overlay target may be utilized to measure the alignment of a first pattern with respect to a second pattern, where the first pattern and the second pattern are successive patterns formed on the same semiconductor layer.

For instance, in a measurement utilizing two or more overlay targets, an overlay target may be printed at a specific location on a first wafer layer and a second wafer layer, so that when the first and second layers are properly aligned the pattern elements of the first structure and second structure of the overlay target also align. When the first and second layers are "mis-registered," however, a relative shift between the pattern elements of the first structure 102 and the second structure 104 of a given thin overlay mark 100 exists, a shift that can be measured through a variety of techniques.

The structures and pattern elements described herein may be fabricated using any process known in the art suitable for semiconductor wafer processing, such as, but not limited to, photolithographic, etching, and deposition techniques.

Figure 1:
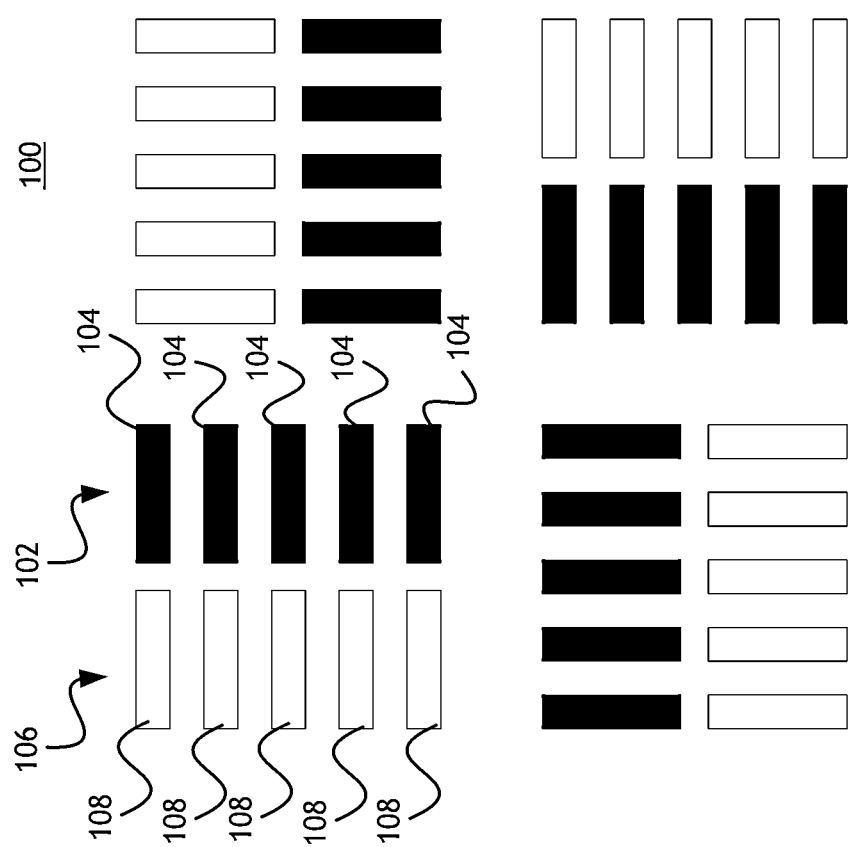
FIG. 1 is a top plan view of an overlay target.
Figure 2:
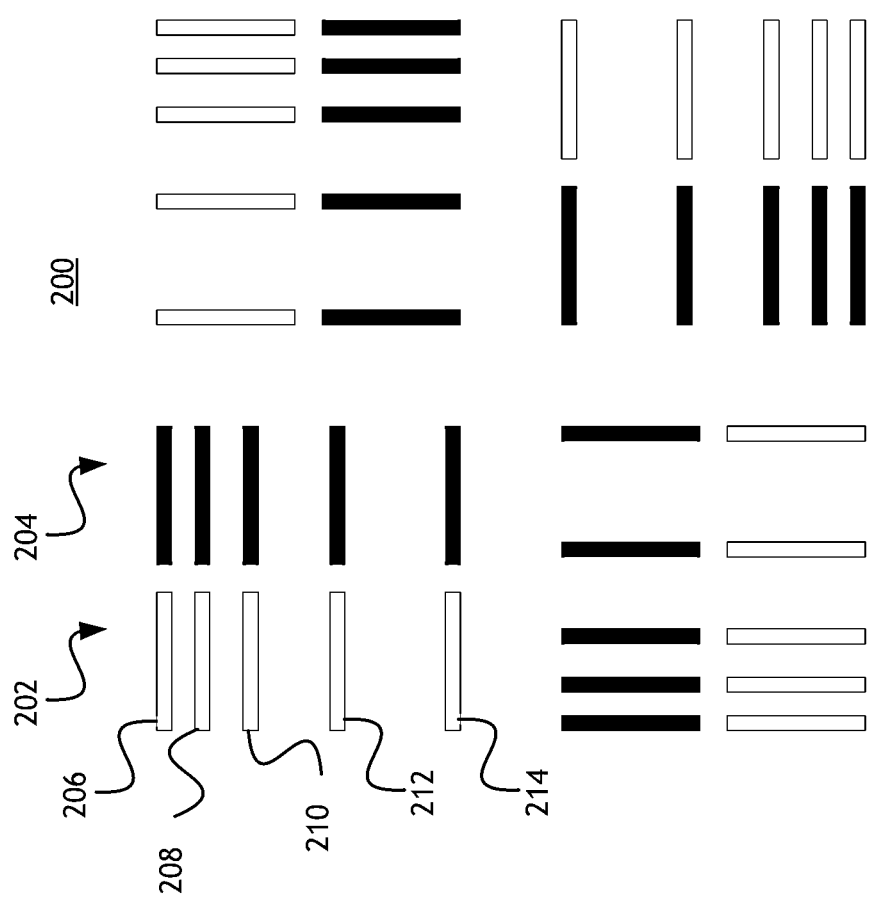
FIG. 2 is a top plan view of an overlay target, in accordance with one embodiment of the present invention.

FIG. 2 illustrates a top plan view of an overlay target 200 suitable for imaging based metrology, in accordance with an exemplary embodiment of the present invention. In one aspect, the overlay target 200 may include two or more target structures 202, 204. Each of the two or more target structures 202, 204 may be on one or more semiconductor wafer layers. In another aspect of the target 200, each of the target structures 202, 204 of the overlay target 200 includes two or more pattern elements 206, 208, 210, 212, 214. Note that for the purposes of this disclosure shading patterns in FIG. 2 (and figures throughout this disclosure) are used to represent the different target structures of a target, wherein pattern elements belonging to the same target structure have the same shade. The shading patterns displayed in the various figures of the present disclosure should not be interpreted as limiting as the selected shading pattern is not representative of a structural aspect of the associated pattern element, but is merely utilized to represent pattern elements of the same target structure. For example, as shown in FIG. 2, the target 200 may include eight target structures 202, 204 (each structure illustrated with a unique shade). Shading patterns may represent target structures deposited on different semiconductor layers. Further, each of the eight target structures 202, 204 of target 200 may include five pattern elements 206, 208, 210, 212, 214. For instance, as shown in FIG. 2, a first target structure 202 may include pattern elements 206, 208, 210, 212, 214. More generally, a given target structure 202, 204 of a target 200 may contain any number of pattern elements 206, 208, 210, 212, 214 greater than two.

In another aspect of a target 200 of the present invention, each of the target structures 202, 204 of a target 200 are designed such that the pattern elements 206, 208, 210, 212, 214 of each target structure 202, 204 define a plurality of pitches. A first pattern element 206 and a second pattern element 208 may be separated by a distance; the distance from the center of the first pattern element 206 to the center of the second pattern element 208 defines a first pitch. The distance from the center of the second pattern element 208 to the center of a third pattern element 210 may define a second pitch. The first pitch and the second pitch may correspond to different pitches of different semiconductor components on the semiconductor wafer. Target structures 202, 204 having pattern elements 206, 208, 210, 212, 214 that define at least a first pitch and a second pitch may provide alignment information for semiconductor components having at least two different pitches.

Similarly, the distance from the center of the third pattern element 210 to the center of a fourth pattern element 212 may define a third pitch, and the distance from the center of the fourth pattern element 212 to the center of a fifth pattern element 214 may define a fourth pitch. A target 200 having target structures 202, 204 with pattern elements 206, 208, 210, 212, 214 defining four different pitches may provide alignment information for semiconductor components with four different pitches. One skilled in the art may appreciate that present invention is not limited to target structures 202, 204 defining four pitches.

It should be recognized that, as a result of misalignment, pattern elements of a first target structure 202 and pattern elements of a second target structure 204 will shift and no longer coincide. It is recognized that this concept may be extended to all of the structures within a given target of the present invention. It is the measurement of this shift between various target structures 202, 204 of a target 200 which enables the overlay measurement.

It may be appreciated by those skilled in the art that the number of target structures 202, 204 and the number of pattern elements 206, 208, 210, 212, 214 within the target structures 202, 204 as depicted in FIG. 2 do not represent limitations, but rather should be interpreted as illustrative in nature.

Moreover, it may be appreciated by those skilled in the art that the use of rectangular target structures 202, 204 and pattern elements 206, 208, 210, 212, 214, as depicted in FIG. 2, is not a limitation and that generally a variety of mark region shapes (e.g., square, trapezoid, parallelogram, or ellipse) may be used to characterize the perimeter of an overlay target boundary.

Generally, the two dimensional shapes of the various pattern elements 206, 208, 210, 212, 214 of the first target structure 202 and the second target structure 204 are not limited. As such, the rectangular shape of the pattern elements, as depicted in FIG. 2, should not be interpreted as a limitation but merely an illustration.

In another aspect, as illustrated in FIG. 2, the target structures 202, 204 and pattern elements 206, 208, 210, 212, 214 of the target 200 may be replicated symmetrically about a point on a semiconductor wafer.

In another aspect, the shapes of the pattern elements 206, 208, 210, 212, 214 within a target structure 202, 204 may be non-uniform (not shown), provided the pattern elements 206, 208, 210, 212, 214 define two or more pitches. More specifically, a given target structure 202, 204 may contain more than one pattern element shapes.

Figure 3:
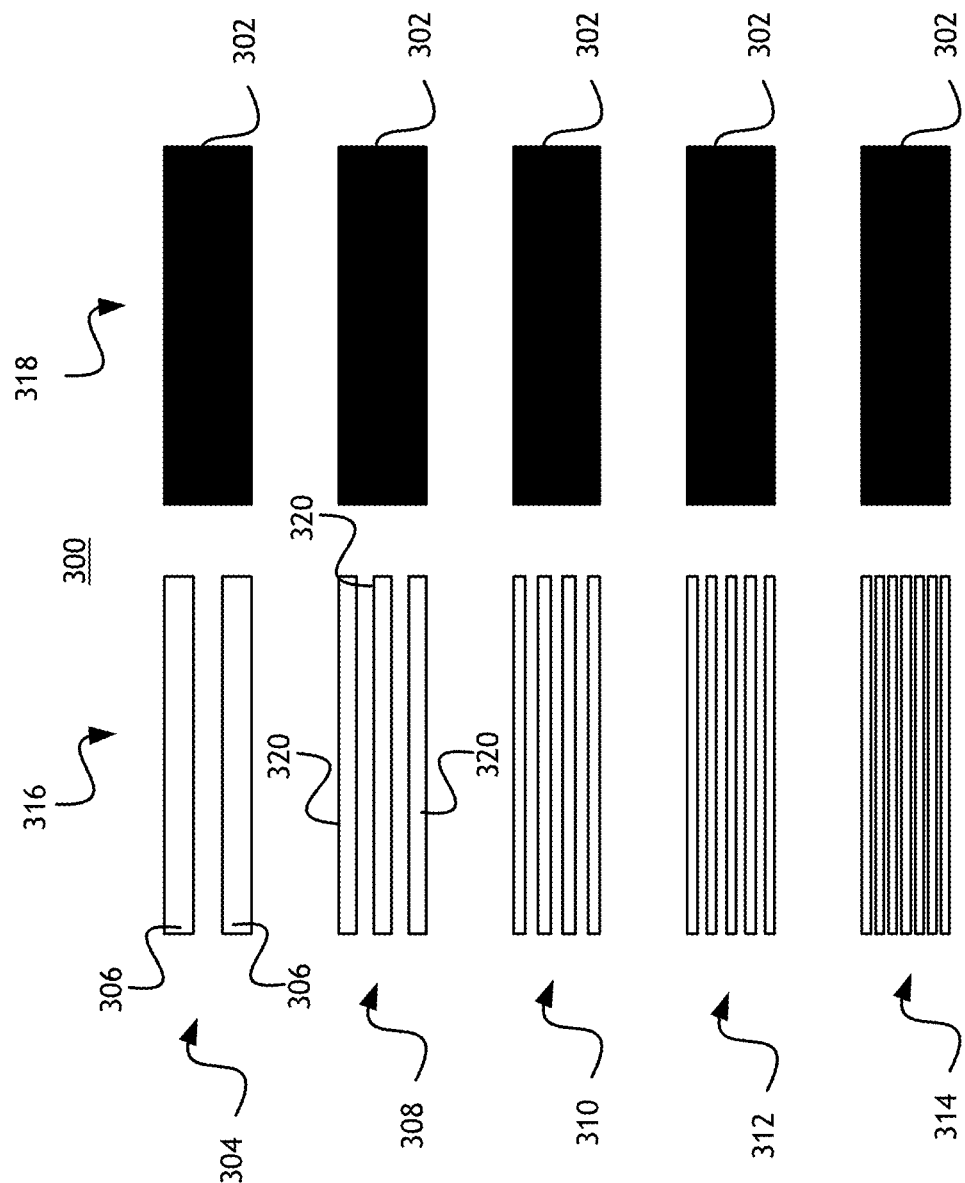
FIG. 3 is a top plan view of an overlay target, in accordance with one embodiment of the present invention.

FIG. 3 illustrates a top plan view of an overlay target 300 suitable for imaging based metrology, in accordance with an exemplary embodiment of the present invention. In one aspect, the overlay target 300 may include two or more target structures 316, 318. Each of the two or more target structures 316, 318 may be on one or more semiconductor wafer layers. In another aspect of the target 300, each of the target structures 316, 318 of the overlay target 300 may include two or more pattern elements 302, 306, 320. A first target structure 318 may include a plurality of substantially similar pattern elements 302, adjacent pattern elements 302 defining substantially similar pitches.

A second target structure 316 may include a plurality of pattern elements 306, 320; the plurality of pattern elements 306, 320 organized into a plurality of pattern element structures 304, 308, 310, 312, 314. Each of the plurality of pattern element structures 304, 308, 310, 312, 314 may comprise a plurality of pattern elements 306, 320; each of the plurality of pattern elements 306, 320 for each pattern element structure 304, 308, 310, 312, 314 may define a pitch. For example, a first pattern element structure 304 may include two pattern elements 306; the two pattern elements 306 may define a first pitch. The first pattern element structure 304, including two pattern elements 306 and the separation between the two pattern elements 306 defining a first pitch, may be substantially similar in size as compared to a pattern element 302 in the first target structure 318.

A second pattern element structure 308 may include three pattern elements 320; any two adjacent pattern elements 320 may define a second pitch. The second pattern element structure 308, including three pattern elements 320 and the corresponding separations between the three pattern elements 320 defining a second pitch, may be substantially similar in size as compared to a pattern element 302 in the first target structure 318.

Similarly, the second target structure 316 may include a third pattern element structure 310, including four pattern elements, any two adjacent pattern elements in the third pattern element structure 310 defining a third pitch. The second target structure 316 may include a fourth pattern element structure 312, including five pattern elements, any two adjacent pattern elements in the fourth pattern element structure 312 defining a fourth pitch. The second target structure 316 may include a fifth pattern element structure 314, including seven pattern elements, any two adjacent pattern elements in the fifth pattern element structure 314 defining a fifth pitch. Furthermore, the distance between any two adjacent pattern element structures 304, 308, 310, 312, 314 may also define a pitch.

Target structures 316, 318 having pattern element structures 304, 308, 310, 312, 314 that define a plurality of pitches may provide alignment information for semiconductor components having a plurality of different pitches. One skilled in the art may appreciate that the present invention is not limited to pattern element structures 304, 308, 310, 312, 314 having two, three, four, five or seven pattern elements 306, 320.

Figure 4:
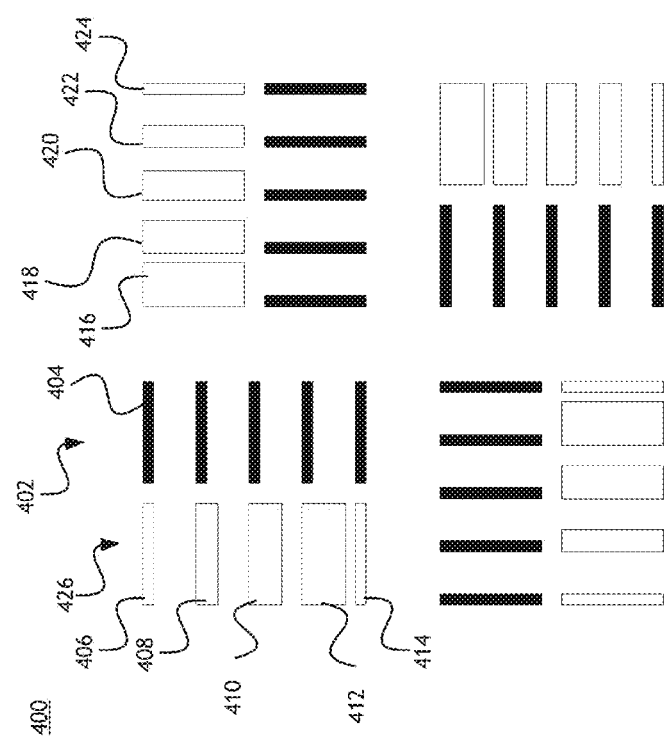
FIG. 4 is a top plan view of an overlay target, in accordance with one embodiment of the present invention.

FIG. 4 illustrates a top plan view of an overlay target 400 suitable for imaging based metrology, in accordance with an exemplary embodiment of the present invention. In one aspect, the overlay target 400 may include two or more target structures 402, 426. Each of the two or more target structures 402, 426 may be on one or more semiconductor wafer layers. In another aspect of the target 400, each of the target structures 402, 426 of the overlay target 400 includes two or more pattern elements 404, 406, 408, 410, 412, 414. Each of the target structures 402, 426 of target 400 may include five pattern elements 404, 406, 408, 410, 412, 414. For instance, as shown in FIG. 4, a first target structure 402 may include pattern elements 404; the pattern elements 404 of the first target structure 402 may define a first pitch. More generally, a given target structure 402, 426 of a target 400 may contain any number of pattern element 404, 406, 408, 410, 412, 414 greater than two.

In another aspect of a target 400 of the present invention, one or more pattern elements 404, 406, 408, 410, 412, 414 of the target structures 402, 426 of a target 400 may have varying widths as compared to other pattern elements 404, 406, 408, 410, 412, 414 in the target structure 402, 426. For example, a second target structure 426 may include a first pattern element 406 and a second pattern element 408, where the first pattern element 406 has a different width as compared to the second pattern element 408. Furthermore, the first pattern element 406 and the second pattern element 408 may define a first pitch. The second target structure 426 may include a third pattern element 410 having a different width as compared to the first pattern element 406 and the second pattern element 408. The second pattern element 408 and third pattern element 410 may define a second pitch. The second target structure 426 may include a fourth pattern element 412 having a different width as compared to the first pattern element 406, the second pattern element 408 and the third pattern element 410. The third pattern element 410 and fourth pattern element 412 may define a third pitch.

It should be recognized that incorporating pattern elements 406, 408, 410, 412, 414 having different widths may allow for measurement of various coverage ratios in a semiconductor fabrication process.

It may be appreciated by those skilled in the art that the number of target structures 402, 426 and the number of pattern elements 404, 406, 408, 410, 412, 414 within the target structures 402, 426 as depicted in FIG. 4 do not represent limitations, but rather should be interpreted as illustrative in nature.

Moreover, it may be appreciated by those skilled in the art that the use of rectangular target structures 402, 426 and pattern elements 404, 406, 408, 410, 412, 414, as depicted in FIG. 4, is not a limitation and that generally a variety of mark region shapes (e.g., square, trapezoid, parallelogram, or ellipse) may be used to characterize the perimeter of an overlay target boundary.

Generally, the two dimensional shapes of the various pattern elements 404, 406, 408, 410, 412, 414 of the first target structure 402 and the second target structure 426 are not limited. As such, the rectangular shape of the pattern elements, as depicted in FIG. 4, should not be interpreted as a limitation but merely an illustration.

In another aspect, as illustrated in FIG. 4, the target structures 402, 426 and pattern elements 404, 406, 408, 410, 412, 414 of the target 400 may be replicated symmetrically about a point on a semiconductor wafer.

In another aspect, as illustrated in FIG. 4, the target 400 may include target structures having pattern elements 416, 418, 420, 422, 424 with varying widths that are not replicated symmetrically about a point on a semiconductor wafer.

Figure 5:
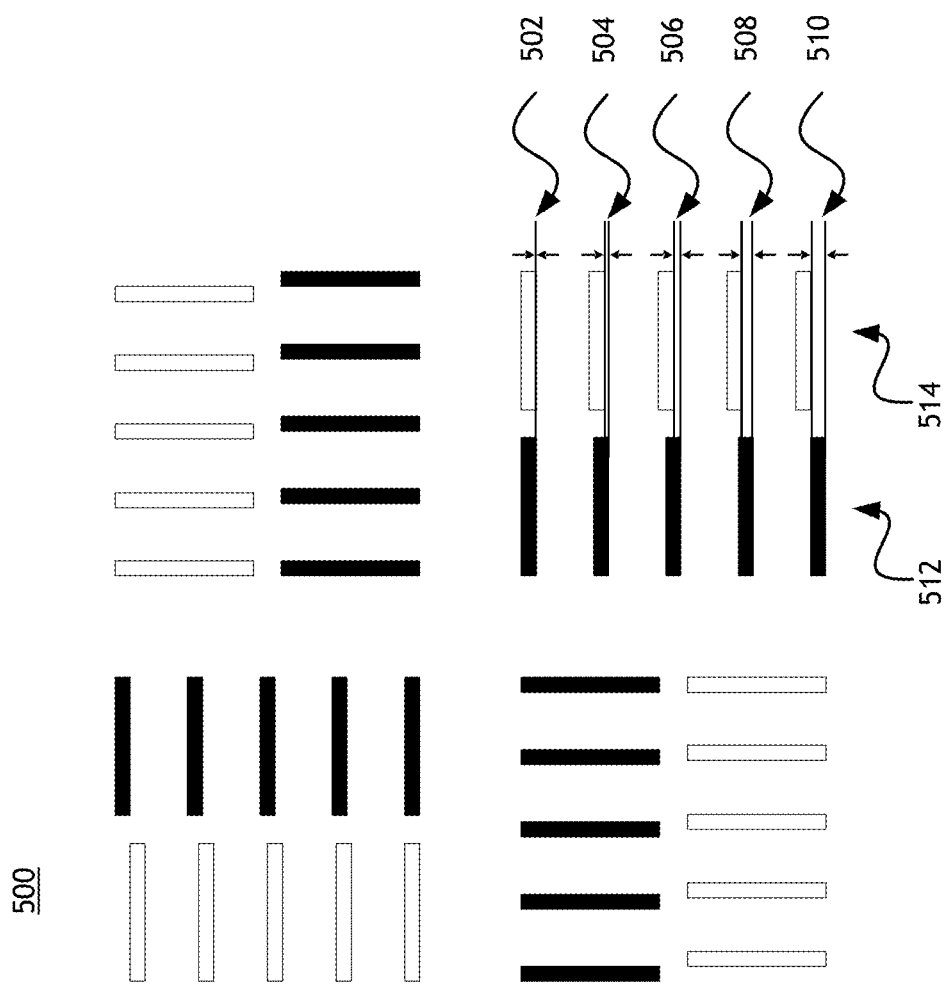
FIG. 5 is a top plan view of an overlay target, in accordance with one embodiment of the present invention.

FIG. 5 illustrates a top plan view of an overlay target 500 suitable for imaging based metrology, in accordance with an exemplary embodiment of the present invention. In one aspect, the overlay target 500 may include two or more target structures 512, 514. Each of the two or more target structures 512, 514 may be on one or more semiconductor wafer layers. In another aspect of the target 500, each of the target structures 512, 514 of the overlay target 500 includes two or more pattern elements 502, 504, 506, 508, 510. Further, each of the eight target structures 512, 514 of target 500 may include five pattern elements 502, 504, 506, 508, 510. A given target structure 512, 514 of a target 500 may contain any number of pattern element 502, 504, 506, 508, 510 greater than two.

In another aspect of a target 500 of the present invention, a first target structure 512 may include pattern elements, each adjacent pattern element defining a first pitch. A second target structure 514 may include pattern elements 502, 504, 506, 508, 510, each of the pattern elements defining at least a second pitch. The first pitch and the second pitch may be different such that when a pattern element in the first target structure 512 is aligned with a corresponding pattern element 502, 504, 506, 508, 510 in the second target structure 514, each of the remaining target elements 502, 504, 506, 508, 510 in the second target structure 514 are offset from corresponding pattern elements in the first target structure 512 be some known, variable distance.

The measurement of the alignment between certain of the pattern elements 502, 504, 506, 508, 510 of the second target structure 514 as compared to the first target structure 512, and the distance of offset between corresponding pattern elements is a measure of semiconductor component linearity.

It may be appreciated by those skilled in the art that the number of target structures 512, 514 and the number of pattern elements 502, 504, 506, 508, 510 within the target structures 512, 514 as depicted in FIG. 5 do not represent limitations, but rather should be interpreted as illustrative in nature.

Moreover, it may be appreciated by those skilled in the art that the use of rectangular target structures 512, 514 and pattern elements 502, 504, 506, 508, 510, as depicted in FIG. 5, is not a limitation and that generally a variety of mark region shapes (e.g., square, trapezoid, parallelogram, or ellipse) may be used to characterize the perimeter of an overlay target boundary.

Generally, the two dimensional shapes of the various pattern elements 502, 504, 506, 508, 510 of the first target structure 512 and the second target structure 514 are not limited. As such, the rectangular shape of the pattern elements, as depicted in FIG. 5, should not be interpreted as a limitation but merely an illustration.

In another aspect, as illustrated in FIG. 5, the target structures 512, 514 and pattern elements 502, 504, 506, 508, 510 of the target 500 may be replicated symmetrically about a point on a semiconductor wafer.

In another aspect, the shapes of the pattern elements 502, 504, 506, 508, 510 within a target structure 512, 514 may be non-uniform (not shown). More specifically, a given target structure 512, 514 may contain more than one pattern element shapes.

Figure 6:
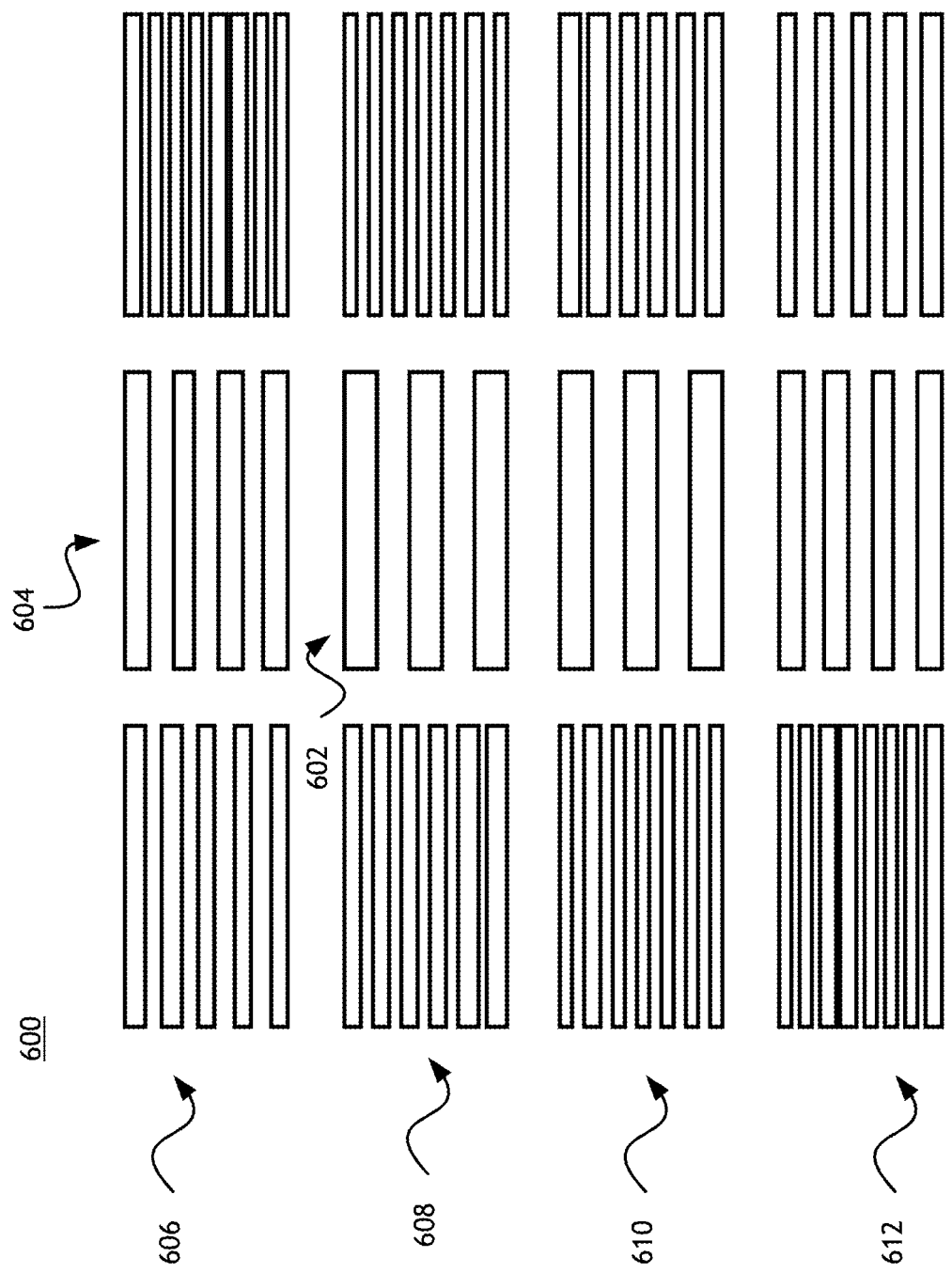
FIG. 6 is a top plan view of an overlay target, in accordance with one embodiment of the present invention.

FIG. 6 illustrates a top plan view of an overlay target 600 suitable for imaging based metrology, in accordance with an exemplary embodiment of the present invention. In one aspect, the overlay target 600 may include two or more target structures 602, 604, 606, 608, 610, 612. Each of the two or more target structures 602, 604, 606, 608, 610, 612 may be on one semiconductor wafer layer. In another aspect of the target 600, each of the target structures 602, 604, 606, 608, 610, 612 of the overlay target 600 may include two or more pattern elements. A first target structure 602 may include three substantially similar pattern elements, adjacent pattern elements defining a first pitch. A second target structure 604 may include four pattern elements, adjacent pattern elements defining a second pitch. Similarly, the overlay target 600 may include additional target structures 606, 608, 610, 612, each including different numbers of pattern elements, and the pattern elements of each additional target structure 606, 608, 610, 612 defining a different pitch. For example, a third target structure 606 may include five substantially similar pattern elements, adjacent pattern elements defining a third pitch; a fourth target structure 608 may include six pattern elements, adjacent pattern elements defining a fourth pitch; a fifth target structure 610 may include seven substantially similar pattern elements, adjacent pattern elements defining a fifth pitch; and a sixth target structure 612 may include eight pattern elements, adjacent pattern elements defining a sixth pitch.

Each of the plurality of target structures 602, 604, 606, 608, 610, 612, including associated pattern elements and the separation between pattern elements defining a pitch, may be substantially similar in size as compared to every other target structure 602, 604, 606, 608, 610, 612 in the overlay target 600.

Target structures 602, 604, 606, 608, 610, 612 having pattern elements that define a plurality of pitches may provide alignment information for semiconductor components having a plurality of different pitches. One skilled in the art may appreciate that the present invention is not limited to target structures 602, 604, 606, 608, 610, 612 having three, four, five, six, seven or eight pattern elements.

In another aspect, as illustrated in FIG. 6, the target structures 602, 604, 606, 608, 610, 612 of the target 600 may be replicated symmetrically about a point on a semiconductor wafer.

Figure 7:
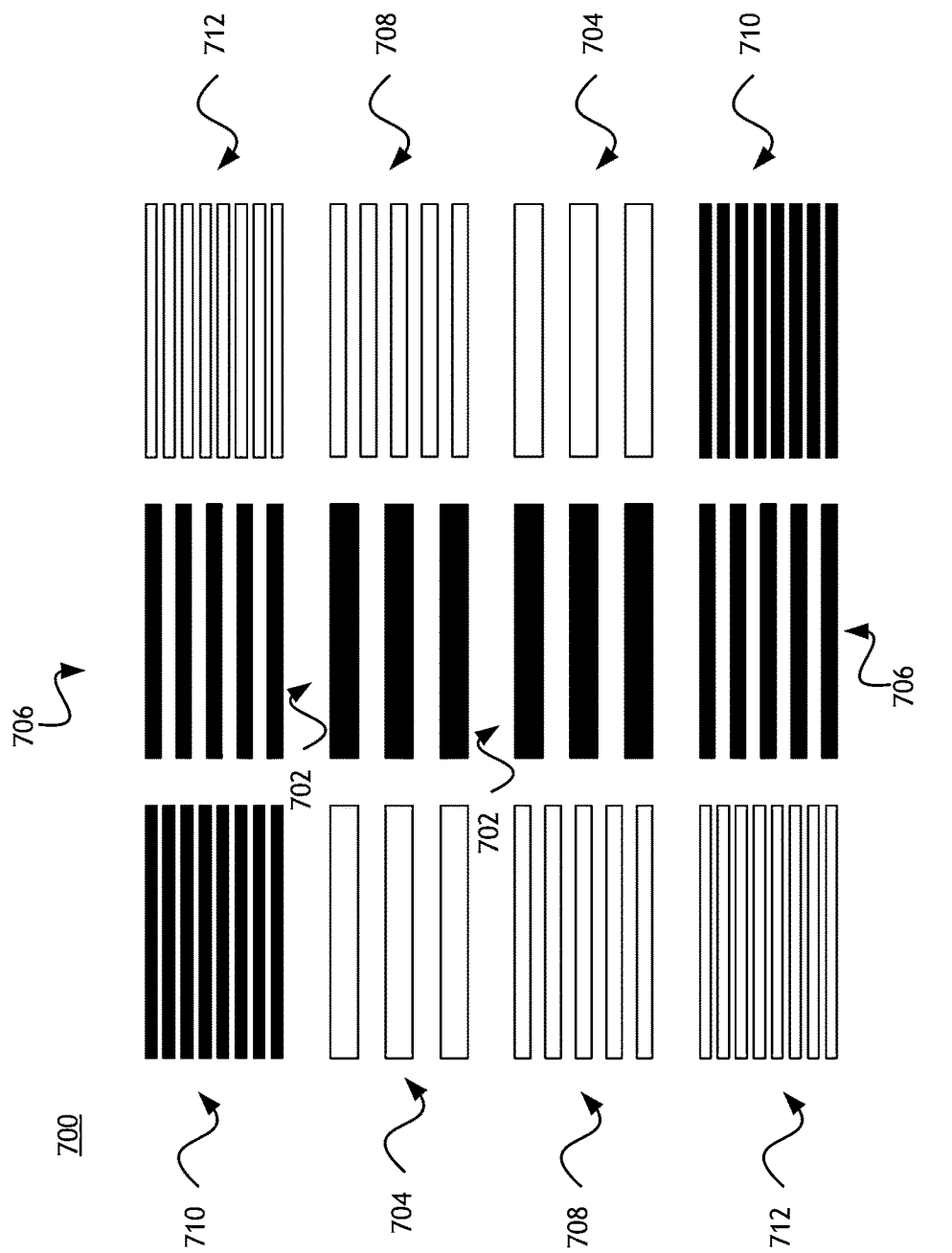
FIG. 7 is a top plan view of an overlay target, in accordance with one embodiment of the present invention.

FIG. 7 illustrates a top plan view of an overlay target 700 suitable for imaging based metrology, in accordance with an exemplary embodiment of the present invention. In one aspect, the overlay target 700 may include two or more target structures 702, 704, 706, 708, 710, 712. Each of the two or more target structures 702, 704, 706, 708, 710, 712 may be on one or more semiconductor wafer layers. For example, a first semiconductor wafer layer may include a plurality of first layer target structures 702, 706, 710, and a second semiconductor wafer layer may include a plurality of second layer target structures 704, 708, 712. In another aspect of the target 700, each of the target structures 702, 704, 706, 708, 710, 712 of the overlay target 700 may include two or more pattern elements. A first target structure 702 in the first semiconductor wafer layer may include three substantially similar pattern elements, adjacent pattern elements defining a first pitch. A second target structure 706 in the first semiconductor wafer layer may include five pattern elements, adjacent pattern elements defining a second pitch. A third target structure 710 in the first semiconductor wafer layer may include eight pattern elements, adjacent pattern elements defining a third pitch.

Similarly, the overlay target 700 may include additional target structures 704, 708, 712 in a second semiconductor wafer layer, each including different numbers of pattern elements, corresponding to a target structure 702, 706, 710 in the first semiconductor wafer layer. For example, a first target structure 704 in the second semiconductor wafer layer may include three substantially similar pattern elements, adjacent pattern elements defining a first pitch; a second target structure 708 in the second semiconductor wafer layer may include five pattern elements, adjacent pattern elements defining a second pitch; and a third target structure 712 in the second semiconductor wafer layer may include eight pattern elements, adjacent pattern elements defining a third pitch.

Each of the plurality of target structures 702, 704, 706, 708, 710, 712, including associated pattern elements and the separation between pattern elements defining a pitch, may be substantially similar in size as compared to every other target structure 702, 704, 706, 708, 710, 712 in the overlay target 700.

Target structures 702, 704, 706, 708, 710, 712 having pattern elements that define a plurality of pitches may provide alignment information for semiconductor components having a plurality of different pitches. One skilled in the art may appreciate that the present invention is not limited to target structures 702, 704, 706, 708, 710, 712 having three, five or eight pattern elements. Furthermore, one skilled in the art may appreciate that target structures may be placed in separate layers of a semiconductor wafer.

In another aspect, as illustrated in FIG. 7, the target structures 702, 704, 706, 708, 710, 712 of the target 700 may be replicated symmetrically about a point on a semiconductor wafer.

Figure 8:
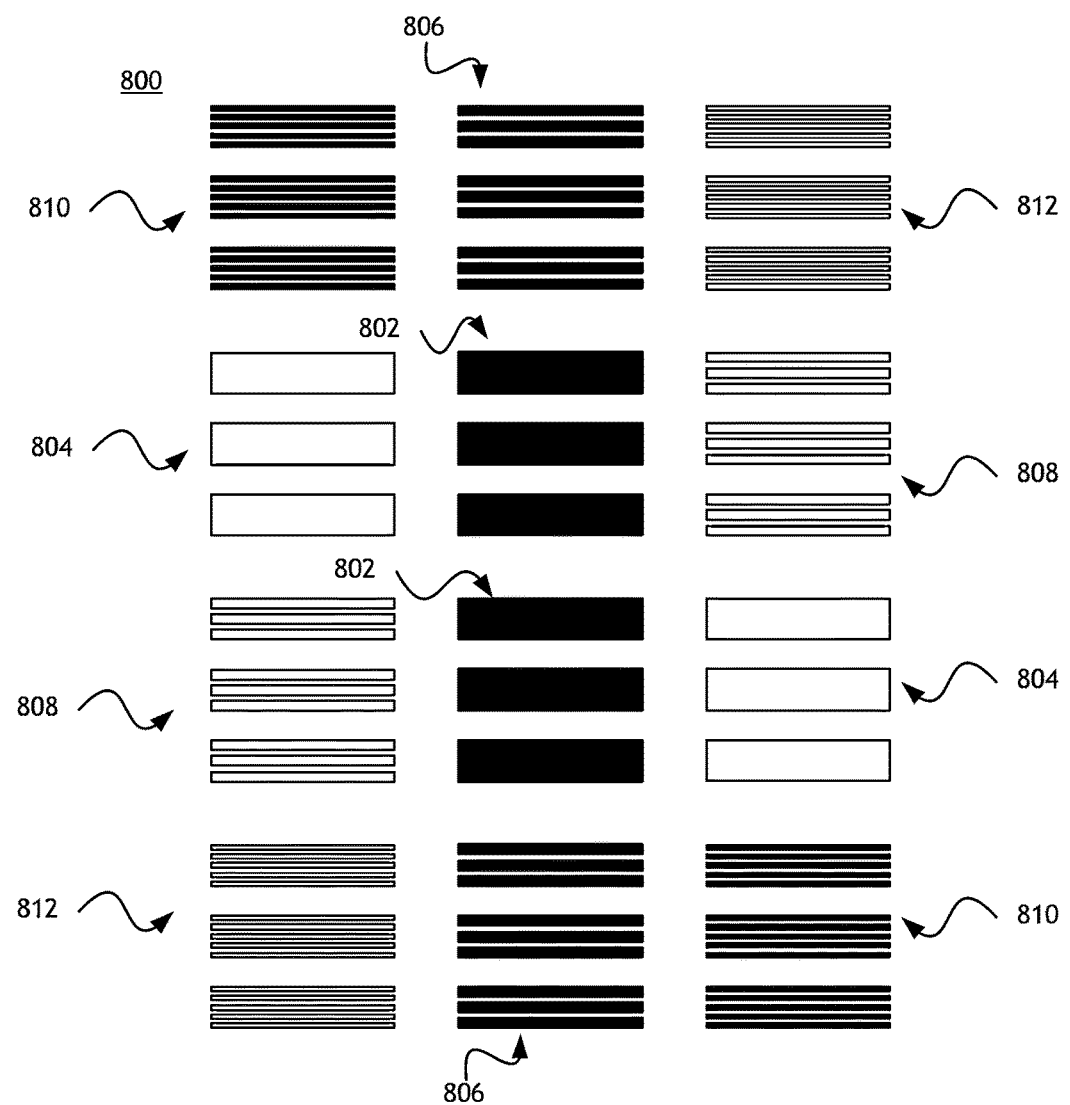
FIG. 8 is a top plan view of an overlay target, in accordance with one embodiment of the present invention.

FIG. 8 illustrates a top plan view of an overlay target 800 suitable for imaging based metrology, in accordance with an exemplary embodiment of the present invention. In one aspect, the overlay target 800 may include two or more target structures 802, 804, 806, 808, 810, 812. Each of the two or more target structures 802, 804, 806, 808, 810, 812 may be on one or more semiconductor wafer layers. For example, a first semiconductor wafer layer may include a plurality of first layer target structures 802, 806, 810, and a second semiconductor wafer layer may include a plurality of second layer target structures 804, 808, 812. In another aspect of the target 800, each of the target structures 802, 804, 806, 808, 810, 812 of the overlay target 800 may include two or more pattern elements. A first target structure 802 in the first semiconductor wafer layer may include three substantially similar pattern elements, adjacent pattern elements defining a first pitch. A second target structure 806 in the first semiconductor wafer layer may include nine pattern elements organized into three pattern element structures of three pattern elements each, adjacent pattern elements of each pattern element structure defining a second pitch. A third target structure 810 in the first semiconductor wafer layer may include fifteen pattern elements organized into three pattern element structures of five pattern elements each, adjacent pattern elements defining a third pitch. One skilled in the art may appreciate that number of pattern element structures and the number of pattern elements in each pattern element structure is merely exemplary, and that other numbers of pattern element structures and pattern elements in each pattern element structure may be utilized.

Similarly, the overlay target 800 may include additional target structures 804, 808, 812 in a second semiconductor wafer layer, each including different numbers of pattern elements, corresponding to a target structure 802, 806, 810 in the first semiconductor wafer layer. For example, a first target structure 804 in the second semiconductor wafer layer may include three substantially similar pattern elements, adjacent pattern elements defining a first pitch; a second target structure 808 in the second semiconductor wafer layer may include nine pattern elements organized into three pattern element structures of three pattern elements each, adjacent pattern elements defining a second pitch; and a third target structure 812 in the second semiconductor wafer layer may include fifteen pattern elements organized into three pattern element structures of five pattern elements each, adjacent pattern elements defining a third pitch.

Each of the plurality of target structures 802, 804, 806, 808, 810, 812, including associated pattern elements and the separation between pattern elements defining a pitch, may be substantially similar in size as compared to every other target structure 802, 804, 806, 808, 810, 812 in the overlay target 800.

Target structures 802, 804, 806, 808, 810, 812 having pattern elements that define a plurality of pitches may provide alignment information for semiconductor components having a plurality of different pitches. One skilled in the art may appreciate that the present invention is not limited to target structures 802, 804, 806, 808, 810, 812 having three, nine or fifteen pattern elements. Furthermore, one skilled in the art may appreciate that target structures may be placed in separate layers of a semiconductor wafer.

In another aspect, as illustrated in FIG. 8, the target structures 802, 804, 806, 808, 810, 812 of the target 800 may be replicated symmetrically about a point on a semiconductor wafer.

Figure 9:
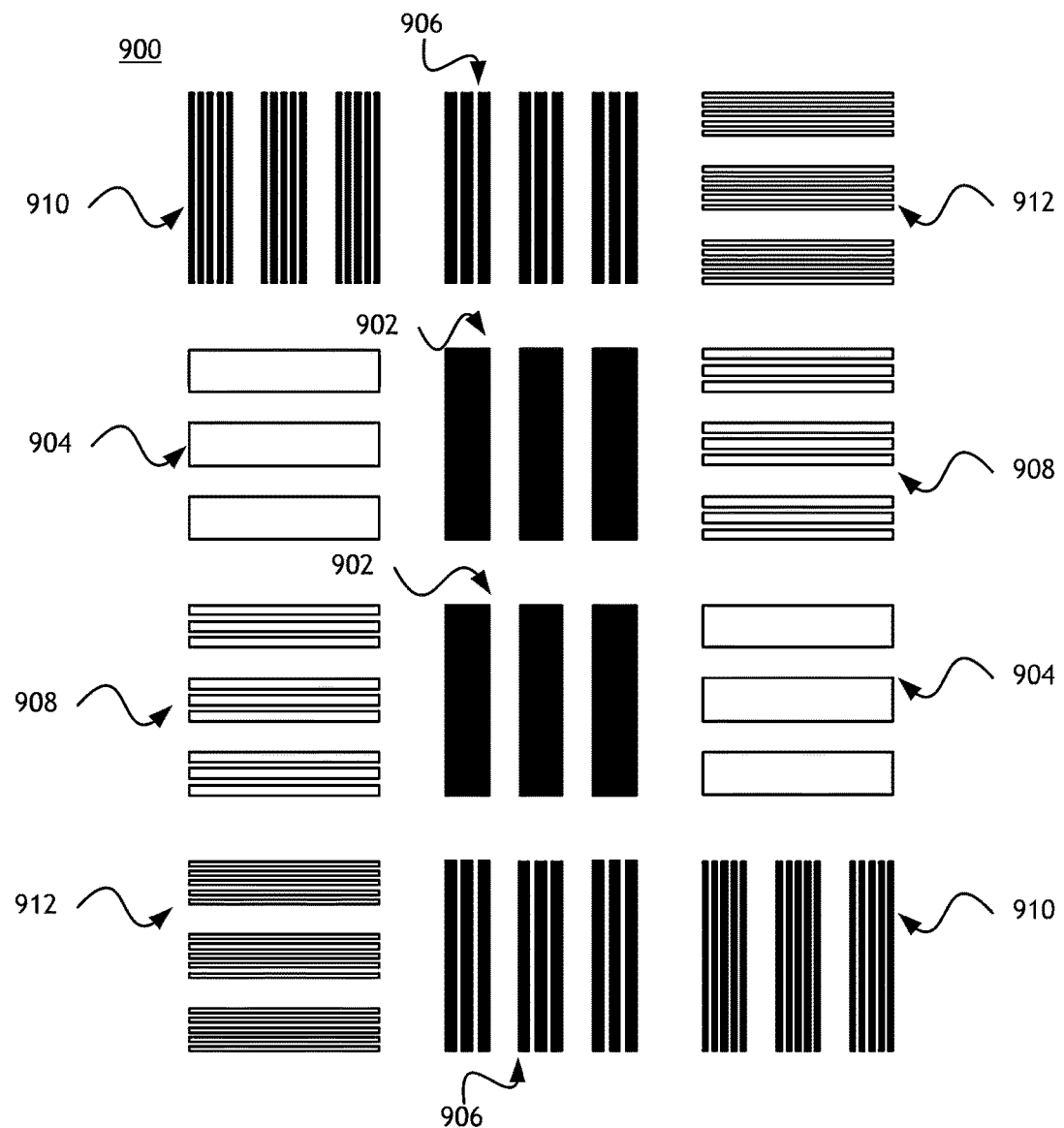
FIG. 9 is a top plan view of an overlay target, in accordance with one embodiment of the present invention.

FIG. 9 illustrates a top plan view of an overlay target 900 suitable for imaging based metrology, in accordance with an exemplary embodiment of the present invention. In one aspect, the overlay target 900 may include two or more target structures 902, 904, 906, 908, 910, 912. Each of the two or more target structures 902, 904, 906, 908, 910, 912 may be on one or more semiconductor wafer layers. For example, a first semiconductor wafer layer may include a plurality of first layer target structures 902, 906, 910, and a second semiconductor wafer layer may include a plurality of second layer target structures 904, 908, 912. In another aspect of the target 900, each of the target structures 902, 904, 906, 908, 910, 912 of the overlay target 900 may include two or more pattern elements. A first target structure 902 in the first semiconductor wafer layer may include three substantially similar pattern elements, adjacent pattern elements defining a first pitch. A second target structure 906 in the first semiconductor wafer layer may include nine pattern elements organized into three pattern element structures of three pattern elements each, adjacent pattern elements of each pattern element structure defining a second pitch. A third target structure 910 in the first semiconductor wafer layer may include fifteen pattern elements organized into three pattern element structures of five pattern elements each, adjacent pattern elements defining a third pitch. One skilled in the art may appreciate that number of pattern element structures and the number of pattern elements in each pattern element structure is merely exemplary, and that other numbers of pattern element structures and pattern elements in each pattern element structure may be utilized.

Similarly, the overlay target 900 may include additional target structures 904, 908, 912 in a second semiconductor wafer layer, each including different numbers of pattern elements, corresponding to a target structure 902, 906, 910 in the first semiconductor wafer layer. For example, a first target structure 904 in the second semiconductor wafer layer may include three substantially similar pattern elements, adjacent pattern elements defining a first pitch; a second target structure 908 in the second semiconductor wafer layer may include nine pattern elements organized into three pattern element structures of three pattern elements each, adjacent pattern elements defining a second pitch; and a third target structure 912 in the second semiconductor wafer layer may include fifteen pattern elements organized into three pattern element structures of five pattern elements each, adjacent pattern elements defining a third pitch.

Target structures 904, 908, 912 in a second semiconductor wafer layer may be oriented with opposite directional interest as compared to target structures 902, 906, 910 in a first semiconductor wafer layer. For example, pattern elements comprising the target structures 904, 908, 912 in the second semiconductor wafer layer may be oriented orthogonally to similar pattern elements comprising the target structures 902, 906, 910 in the first semiconductor wafer layer.

Each of the plurality of target structures 902, 904, 906, 908, 910, 912, including associated pattern elements and the separation between pattern elements defining a pitch, may be substantially similar in size as compared to every other target structure 902, 904, 906, 908, 910, 912 in the overlay target 900.

Target structures 902, 904, 906, 908, 910, 912 having pattern elements that define a plurality of pitches may provide alignment information for semiconductor components having a plurality of different pitches. One skilled in the art may appreciate that the present invention is not limited to target structures 902, 904, 906, 908, 910, 912 having three, nine or fifteen pattern elements. Furthermore, one skilled in the art may appreciate that target structures may be placed in separate layers of a semiconductor wafer.

In another aspect, as illustrated in FIG. 9, the target structures 902, 904, 906, 908, 910, 912 of the target 900 may be replicated symmetrically about a point on a semiconductor wafer.

Figure 10:
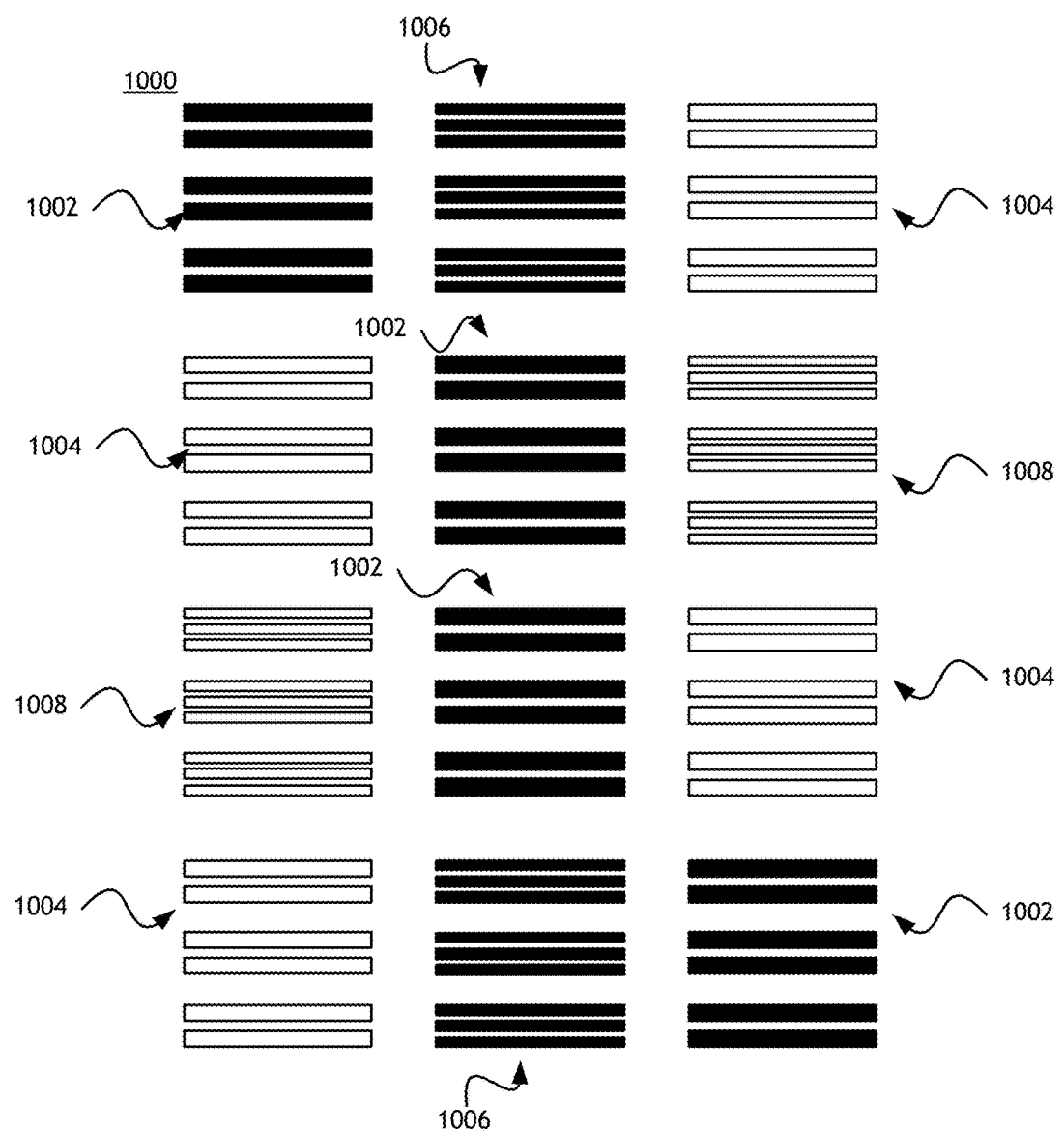
FIG. 10 is a top plan view of an overlay target, in accordance with one embodiment of the present invention.

FIG. 10 illustrates a top plan view of an overlay target 1000 suitable for imaging based metrology, in accordance with an exemplary embodiment of the present invention. In one aspect, the overlay target 1000 may include two or more target structures 1002, 1004, 1006, 1008. Each of the two or more target structures 1002, 1004, 1006, 1008 may be on one or more semiconductor wafer layers. For example, a first semiconductor wafer layer may include a plurality of first layer target structures 1002, 1006, and a second semiconductor wafer layer may include a plurality of second layer target structures 1004, 1008. In another aspect of the target 1000, each of the target structures 1002, 1004, 1006, 1008 of the overlay target 1000 may include two or more pattern elements. A first target structure 1002 in the first semiconductor wafer layer may include six pattern elements organized into three pattern element structures of two pattern elements each, adjacent pattern elements defining a first pitch. A second target structure 1006 in the first semiconductor wafer layer may include nine pattern elements organized into three pattern element structures of three pattern elements each, adjacent pattern elements of each pattern element structure defining a second pitch. One skilled in the art may appreciate that number of pattern element structures and the number of pattern elements in each pattern element structure is merely exemplary, and that other numbers of pattern element structures and pattern elements in each pattern element structure may be utilized.

Similarly, the overlay target 1000 may include additional target structures 1004, 1008 in a second semiconductor wafer layer, each including different numbers of pattern elements, corresponding to a target structure 1002, 1006 in the first semiconductor wafer layer. For example, a first target structure 1004 in the second semiconductor wafer layer may include six pattern elements organized into three pattern element structures of two pattern elements each, adjacent pattern elements defining a first pitch; a second target structure 1008 in the second semiconductor wafer layer may include nine pattern elements organized into three pattern element structures of three pattern elements each, adjacent pattern elements defining a second pitch.

Each of the plurality of target structures 1002, 1004, 1006, 1008, including associated pattern elements and the separation between pattern elements defining a pitch, may be substantially similar in size as compared to every other target structure 1002, 1004, 1006, 1008 in the overlay target 1000.

Target structures 1002, 1004, 1006, 1008 having pattern elements that define a plurality of pitches may provide alignment information for semiconductor components having a plurality of different pitches. One skilled in the art may appreciate that the present invention is not limited to target structures 1002, 1004, 1006, 1008 having six or nine pattern elements. Furthermore, one skilled in the art may appreciate that target structures may be placed in separate layers of a semiconductor wafer.

In another aspect, as illustrated in FIG. 10, the target structures 1002, 1004, 1006, 1008 of the target 1000 may be replicated symmetrically about a point on a semiconductor wafer.

Figure 11:
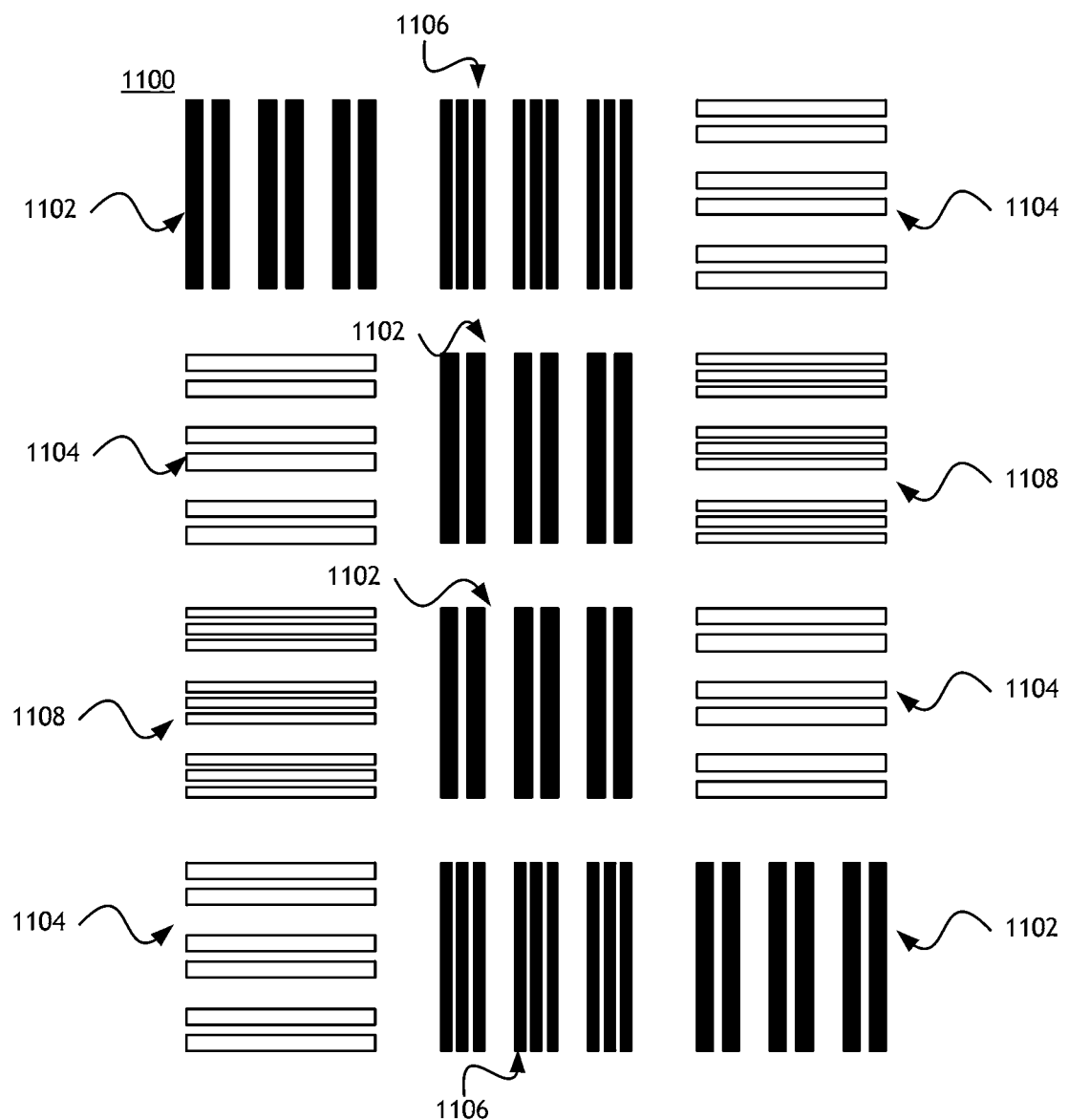
FIG. 11 is a top plan view of an overlay target, in accordance with one embodiment of the present invention.

FIG. 11 illustrates a top plan view of an overlay target 1100 suitable for imaging based metrology, in accordance with an exemplary embodiment of the present invention. In one aspect, the overlay target 1100 may include two or more target structures 1102, 1104, 1106, 1108. Each of the two or more target structures 1102, 1104, 1106, 1108 may be on one or more semiconductor wafer layers. For example, a first semiconductor wafer layer may include a plurality of first layer target structures 1102, 1106, and a second semiconductor wafer layer may include a plurality of second layer target structures 1104, 1108. In another aspect of the target 1100, each of the target structures 1102, 1104, 1106, 1108 of the overlay target 1100 may include two or more pattern elements. A first target structure 1102 in the first semiconductor wafer layer may include six pattern elements organized into three pattern element structures of two pattern elements each, adjacent pattern elements defining a first pitch. A second target structure 1106 in the first semiconductor wafer layer may include nine pattern elements organized into three pattern element structures of three pattern elements each, adjacent pattern elements of each pattern element structure defining a second pitch. One skilled in the art may appreciate that number of pattern element structures and the number of pattern elements in each pattern element structure is merely exemplary, and that other numbers of pattern element structures and pattern elements in each pattern element structure may be utilized.

Similarly, the overlay target 1100 may include additional target structures 1104, 1108 in a second semiconductor wafer layer, each including different numbers of pattern elements, corresponding to a target structure 1102, 1106 in the first semiconductor wafer layer. For example, a first target structure 1104 in the second semiconductor wafer layer may include six pattern elements organized into three pattern element structures of two pattern elements each, adjacent pattern elements defining a first pitch; a second target structure 1108 in the second semiconductor wafer layer may include nine pattern elements organized into three pattern element structures of three pattern elements each, adjacent pattern elements defining a second pitch.

Target structures 1104, 1108 in a second semiconductor wafer layer may be oriented with opposite directional interest as compared to target structures 1102, 1106 in a first semiconductor wafer layer. For example, pattern elements comprising the target structures 1104, 1108 in the second semiconductor wafer layer may be oriented orthogonally to similar pattern elements comprising the target structures 1102, 1106 in the first semiconductor wafer layer.

Each of the plurality of target structures 1102, 1104, 1106, 1108, including associated pattern elements and the separation between pattern elements defining a pitch, may be substantially similar in size as compared to every other target structure 1102, 1104, 1106, 1108 in the overlay target 1100.

Target structures 1102, 1104, 1106, 1108 having pattern elements that define a plurality of pitches may provide alignment information for semiconductor components having a plurality of different pitches. One skilled in the art may appreciate that the present invention is not limited to target structures 1102, 1104, 1106, 1108 having six or nine pattern elements. Furthermore, one skilled in the art may appreciate that target structures may be placed in separate layers of a semiconductor wafer.

In another aspect, as illustrated in FIG. 11, the target structures 1102, 1104, 1106, 1108 of the target 1100 may be replicated symmetrically about a point on a semiconductor wafer.

Figure 12:
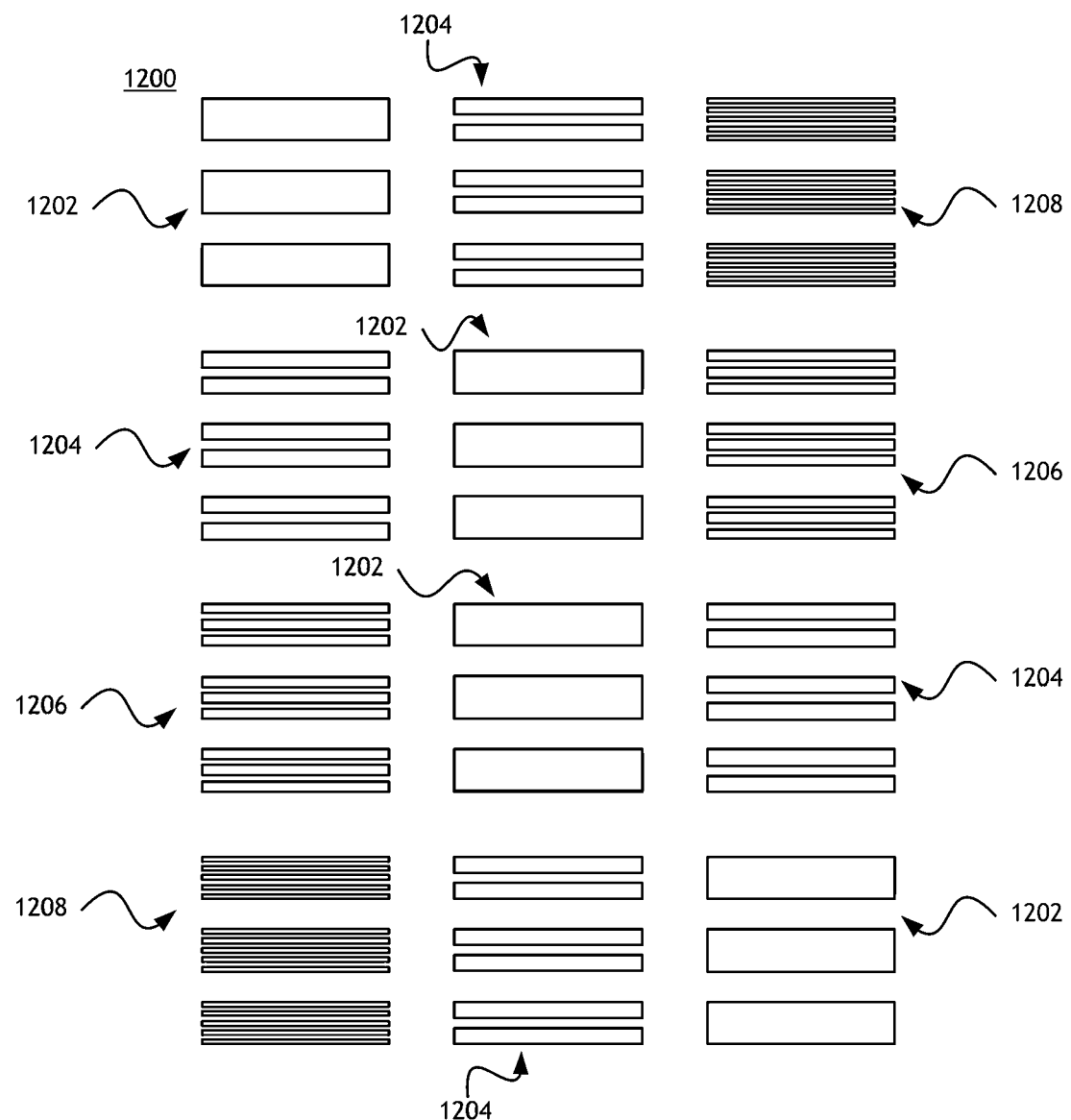
FIG. 12 is a top plan view of an overlay target, in accordance with one embodiment of the present invention.

FIG. 12 illustrates a top plan view of an overlay target 1200 suitable for imaging based metrology, in accordance with an exemplary embodiment of the present invention. In one aspect, the overlay target 1200 may include two or more target structures 1202, 1204, 1206, 1208. Each of the two or more target structures 1202, 1204, 1206, 1208 may be on one semiconductor wafer layer. In another aspect of the target 1200, each of the target structures 1202, 1204, 1206, 1208 of the overlay target 1200 may include two or more pattern elements. A first target structure 1202 may include three substantially similar pattern elements, adjacent pattern elements defining a first pitch. A second target structure 1204 may include six pattern elements organized into three pattern element structures of two pattern elements each, adjacent pattern elements of each pattern element structure defining a second pitch. A third target structure 1206 may include nine pattern elements organized into three pattern element structures of three pattern elements each, adjacent pattern elements defining a third pitch. A fourth target structure 1208 may include fifteen pattern elements organized into three pattern element structures of five pattern elements each, adjacent pattern elements defining a fourth pitch. One skilled in the art may appreciate that number of pattern element structures and the number of pattern elements in each pattern element structure is merely exemplary, and that other numbers of pattern element structures and pattern elements in each pattern element structure may be utilized.

Each of the plurality of target structures 1202, 1204, 1206, 1208, including associated pattern elements and the separation between pattern elements defining a pitch, may be substantially similar in size as compared to every other target structure 1202, 1204, 1206, 1208 in the overlay target 1200.

Target structures 1202, 1204, 1206, 1208 having pattern elements that define a plurality of pitches may provide alignment information for semiconductor components having a plurality of different pitches. One skilled in the art may appreciate that the present invention is not limited to target structures 1202, 1204, 1206, 1208 having three, six, nine or fifteen pattern elements.

In another aspect, as illustrated in FIG. 12, the target structures 1202, 1204, 1206, 1208 of the target 1200 may be replicated symmetrically about a point on a semiconductor wafer.

Figure 13:
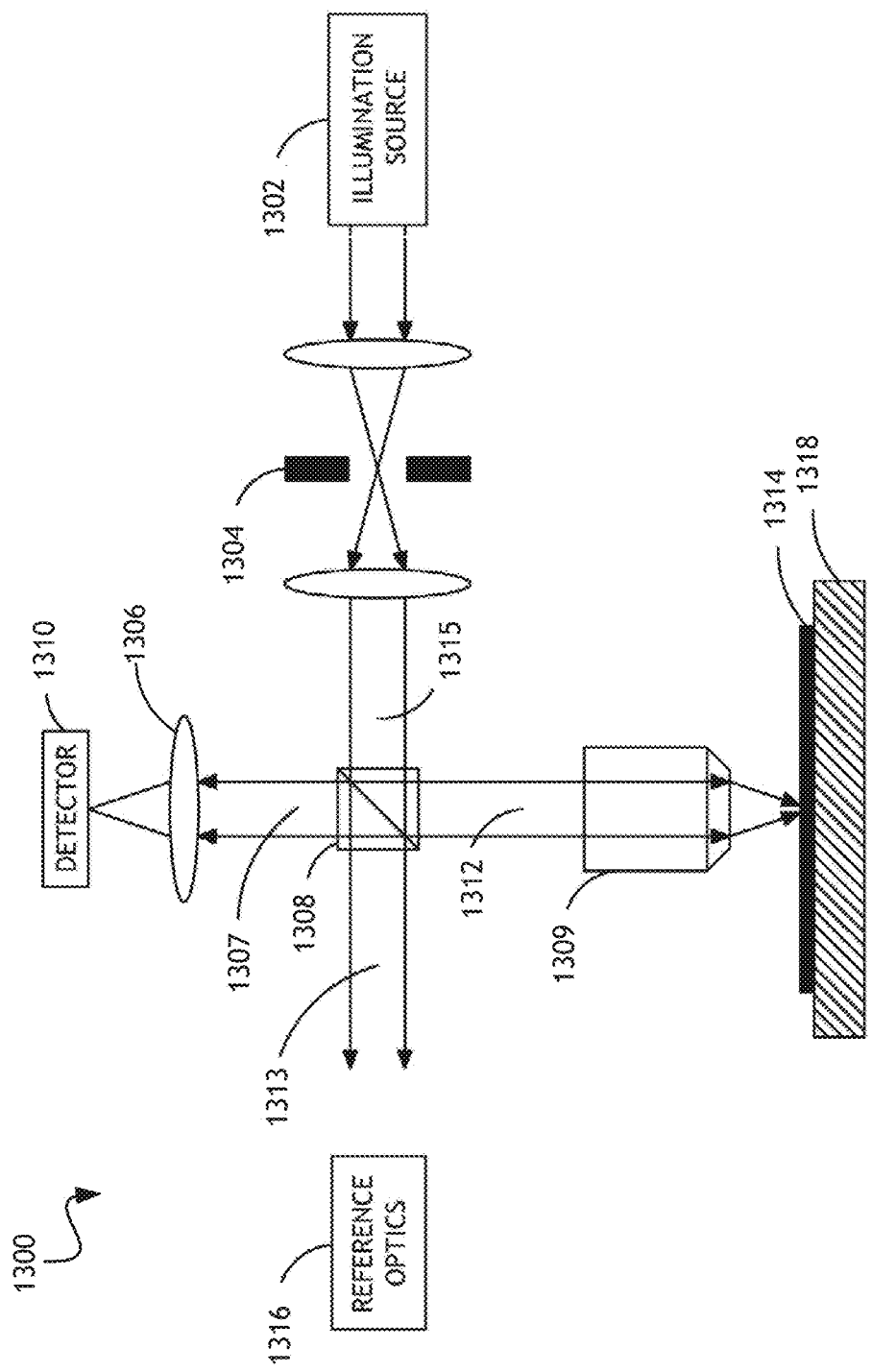
FIG. 13 is a block diagram view of a system suitable for contrast enhancement of a multi-layer overlay metrology target.

Referring now to FIG. 13, the system 1300 suitable for contrast enhancement of an overlay metrology target may include an illumination source 1302, an aperture 1304, a beam splitter 1308, and a detector 1310 configured to receive light reflected from one or more specimens 1314 (e.g., one or more wafers of a wafer lot).

The illumination source 1302 of the system 1300 may include any illumination source known in the art. In one embodiment, the illumination source 1302 may include a broadband light source (e.g., white light source). For example, the illumination source 1302 may include, but is not limited to, a halogen light source (HLS). For instance, the halogen light source may include, but is not limited to, a tungsten based halogen lamp. In another example, the illumination source 1302 may include a Xenon arc lamp.

In another aspect of the present invention, the beam splitter 1308 of the system 1300 may split the light beam emanating from an illumination source 1302, after passing through the aperture, into two paths: an object path 1312 and a reference path 1313. In this sense, the object path 1312 and the reference path 113 of the system 1300 may form a portion of a two beam interference optical system. For example, the beam splitter 1308 may direct a first portion of the beam of light from the illumination path 1315 along the object path 1312, while allowing a second portion of the beam of light from the illumination path 1315 to be transmitted along the reference path 1313. More specifically, the beam splitter 1308 may direct a portion of the light emanating from the illumination source 1302, after passing through the aperture 1304, to the surface of the specimen 1314 (e.g., via object path 1312) disposed on the specimen stage 1318. Moreover, the beam splitter 1308 may transmit a second portion of the light emanating from the illumination source 1302 to the components of the reference path 1313. For instance, the beam splitter 1308 may transmit a portion of light from the illumination path 1315 along the reference path 1313 to a reference mirror (not shown). It should be recognized by those skilled in the art that any beam splitter known in the art is suitable for implementation as the beam splitter 1308 of the present invention.

It should be apparent to those skilled in the art that the reference path 1313 may include, but is not limited to, a reference mirror, a reference objective, and a shutter configured to selectively block the reference path 1313. In a general sense, a two-beam interference optical system may be configured as a Linnik interferometer.

In another embodiment, the system 1300 may include a main objective lens 1309. The main objective lens 1309 may aid in directing light along the object path 1312 to the surface of the specimen 1314 disposed on the specimen stage 1318. For example, the beam splitter 1308 may direct a portion of the light beam from the illumination path 1315 emanating from the illumination source 1302, after passing through the aperture 1304, along the object path 1312. Following the splitting process by the beam splitter 1308, the main objective lens 1309 may focus light from the object path 1312, which is collinear with the primary optical axis 1307, onto the surface of the specimen 1314. In a general sense, any objective lens known in the art may be suitable for implementation as the main objective lens 1309 of the present invention.

Further, a portion of the light impinging on the surface of the specimen 1314 may be reflected by the specimen 1314 and directed along the primary optical axis 1307 via the objective 1309 and the beam splitter 1308 toward the detector 1310. It should be further recognized that intermediate optics devices such as intermediate lenses, additional beam splitters (e.g., a beam splitter configured to split off a portion of light to a focusing system), and imaging lenses 1306 may be placed between the objective 1309 and the imaging plane of the detector 1310.

In another aspect of the present invention, the detector 1310 of the system 1300 may be disposed along the primary optical axis 1307 of the system 1300. In this regard, the camera of the detector 1310 may be arranged to collect imagery data from the surface of the specimen 1314. For example, in a general sense, after reflecting from the surface of the specimen 1314, light may travel along the primary optical axis 1307 to the image plane of the detector 1310 via the main objective 1309 and the beam splitter 1308. It is recognized that any detector system known in the art is suitable for implementation in the present invention. For example, the detector 1310 may include a charge coupled device (CCD) based camera system. By way of another example, the detector 1310 may include a time delay integration (TDI)-CCD based camera system. In a further aspect, the detector 1310 may be communicatively coupled with a computer system (not shown). In this regard, digitized imagery data may be transmitted from the detector 1310 to the computer system via a signal, such as a wireline signal (e.g., copper line, fiber optic cable, and the like) or a wireless signal (e.g., wireless RF signal).

While the above description describes the detector 110 as being located along the primary optical axis 1307 of the system 1300, this characteristic should not be interpreted as a requirement. It is contemplated herein that the detector 1310 may reside along an additional optical axis of the system 1300. For example, in a general sense, one or more additional beam splitters may be utilized to divert a portion of light reflected from the surface of the specimen 1314 and traveling along the object path 1312 onto an additional optical axis, which may be non-parallel to the object path 1312. The camera of the detector 1310 may be arranged such that light traveling along the additional optical axis impinges the image plane of the camera of the detector 1310.

In one aspect of the present invention the aperture 1304 may be positioned at a pupil plane of the illumination path 1315. In this regard, the aperture 1304 may be configured to have a well-defined shape in order to select a predetermined illumination angle of the illumination emanating from the illumination source 1302. The illumination angle is selected so as to achieve a selected contrast level at an imaging plane of the detector 1310.

In one embodiment, the aperture may have a geometric shape or a combination of geometric shapes. For example, the aperture may have an "X" shape or a "cross" shape. In another example, the aperture may have a ring shape. It is further recognized herein that these shapes may be achieved via diffractive optical elements.

In another embodiment, the illumination path may include a plurality of apertures. In this regard, one of the plurality of apertures may be selected during recipe training in order to optimize the contrast level for a specific stack and target design. It is recognized herein that this may be done utilizing a trial and error method. In another embodiment, the aperture 1304 may include a tunable aperture. For example, the aperture 1304 may consist of a tunable aperture that may be programmed by a user in order to produce a plurality of selectable illumination structures. In this regard, a programmed tunable aperture may be tuned in a manner to optimize the contrast for a specific stack or target design. For instance, the tunable aperture may include, but is not limited to, a micro mirror array.

Figure 14:
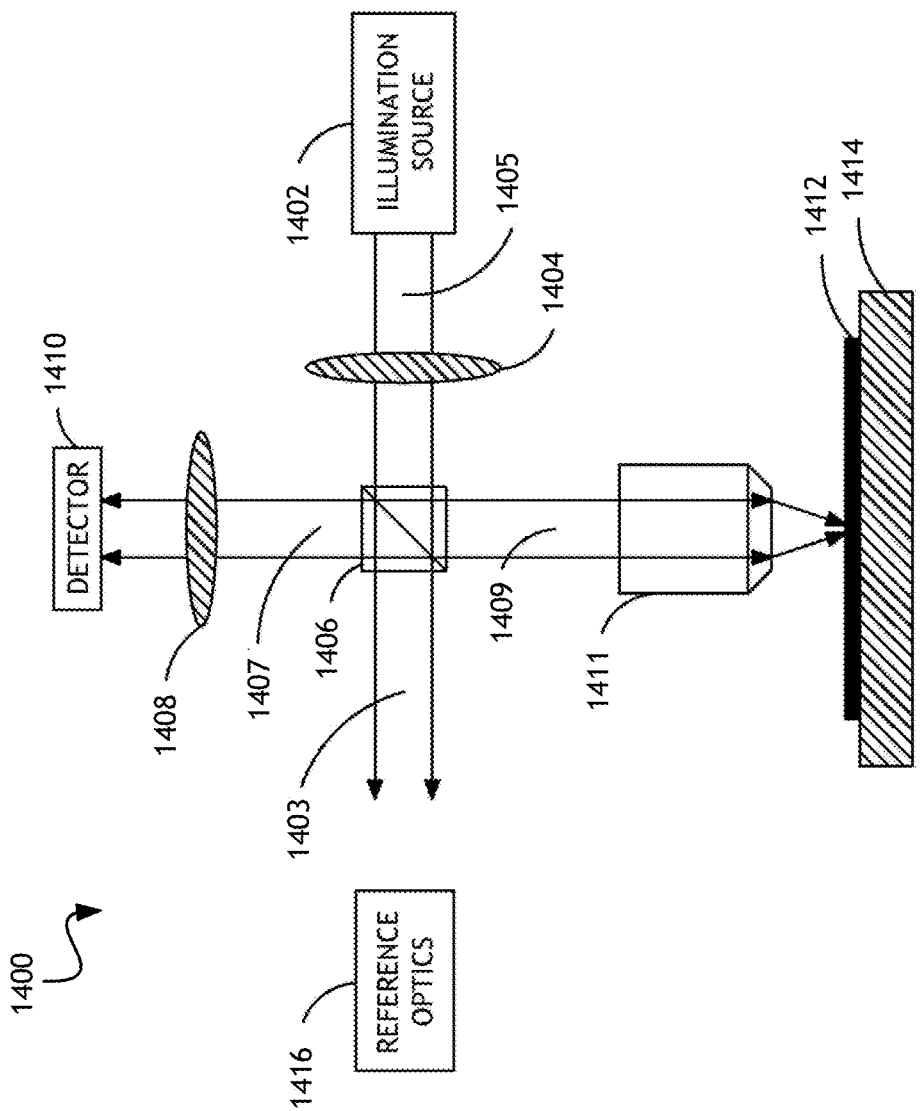
FIG. 14 is a block diagram view of a system suitable for contrast enhancement of a multi-layer overlay metrology target.

Referring now to FIG. 14, the system 1400 suitable for contrast enhancement of a multi-layer overlay metrology target may include an illumination source 1402, a first polarizer 1404, a beam splitter 1406, a second polarizer 1408 and a detector 1410 configured to receive light reflected from one or more specimens 1412 (e.g., one or more wafers of a wafer lot).

It is recognized herein that the illumination source 1402, the beam splitter 1406, the detector 1410, the specimen stage 1414, and the reference path 1403 are similar to the illumination source 1302, the beam splitter 1308, the detector of 1310, the specimen stage 1318, and the reference path of 1313 of the system 1300 depicted in FIG. 13. As such, the description of the system 1300 in FIG. 13 should be interpreted to extend to the system 1400 in FIG. 14 except where otherwise noted.

In one aspect, the first polarizer 1404 is arranged to polarize light emanating from the illumination source 1402. For example, the first polarizer 1404 may be disposed along an illumination path 1405 such that light emanating from the illumination source 1402 may be polarized by the first polarizer 1404.

In another aspect, the second polarizer 1408 may be arranged to serve as an analyzer for light reflected from the specimen 1412. In this regard, the first polarizer 1404 and the second polarizer 1408 may be configured such that the amount of light reflected from unpatterned parts of the specimen 1412 or from periodic unresolved patterns of the specimen 1412 that reaches the imaging plane of the detector 1410 is minimized. In one embodiment, the first polarizer 1404 and the second polarizer 1408 may both include linear polarizers. In the case of linear polarizers, the first polarizer 1404 and the second polarizer 1408 may be arranged such that their polarizing axes are substantially perpendicular to one another. As a result of this configuration, the majority of reflected light reaching the imaging plane of the detector 1410 consists of light reflected from patterns of the specimen resolved by the metrology tool, enhancing the contrast significantly. In further another, the first polarizer 1404 may include a polarizer configured to transmit only radially polarized light, while the second polarizer is 1408 configured to transmit only azimuthally polarized light.

It should be further recognized that the signal from unpatterned portions of the specimen 1412 may be minimized in a variety of other manners. For example, it is recognized herein that a combination of wave-plates and polarizers may be implemented to achieve the results illustrated above. For instance, a first polarizer 1404 and first quarter-wave plate (not shown) oriented at 45 degrees with respect to the first polarizer 1404 may be positioned in the illumination path 1405, while a second polarizer 1408 and a second quarter-wave plate (not shown) oriented at 45 degrees with respect to the second polarizer 1408 may be positioned along the imaging path 1407. Those skilled in the art will recognize that this arrangement may lead to a minimization of the amount light reflected from unpatterned portions of the specimen 1412 which reaches the imaging plane of the detector 1410.

It is further recognized that any combination of polarizers and wave-plates (e.g., half-wave plate) which creates the cross-polarization effect as described above may be suitable for implementation in the present invention.

Figure 15:
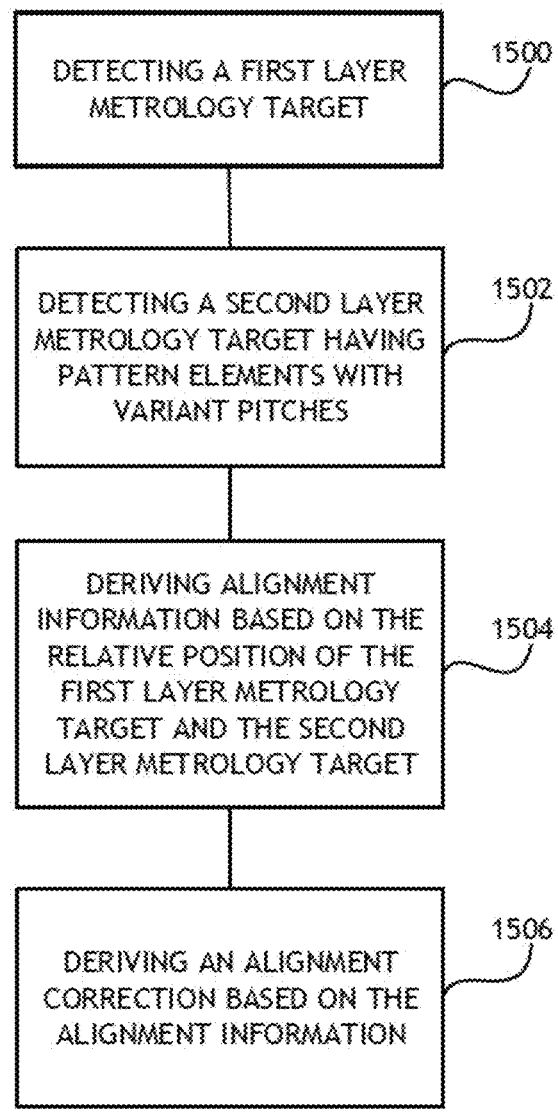
FIG. 15 is a flowchart of a method for a method of using an overlay target according to the present invention to align elements in a semiconductor fabrication process.

FIG. 15 illustrates a flowchart of a method for aligning semiconductor components in a semiconductor fabrication process for semiconductor components having a plurality of pitches. An apparatus such as those depicted in FIG. 13 and FIG. 14 may detect 1500 a first layer metrology target in a semiconductor wafer layer. The first layer metrology target may be formed in the first semiconductor wafer layer through photolithographic processes, deposition, or any other means known in the art. An apparatus such as those depicted in FIG. 13 and FIG. 14 may detect 1502 a second layer metrology target in a semiconductor wafer layer where the second layer metrology target comprises at least one target structure defining a plurality of pitches such as the target structures depicted in FIG. 2-FIG. 7. Furthermore, the second layer metrology target may comprise target structures with pattern elements having variant widths or pattern elements configured to be offset from other pattern elements by a known distance.

A semiconductor fabrication processing device may receive information from the apparatus detecting 1500, 1502 the first layer metrology target and second layer metrology target, and derive 1504 alignment information pertaining to the first semiconductor wafer layer and second semiconductor wafer layer. Alignment information may include the relative positions of target structures defining different pitches. Alignment information for different pitches may be advantageous for aligning semiconductor components in two semiconductor wafer layers where certain semiconductor components have different pitches as compared to other semiconductor components. Alignment information may also include coverage ratios for different semiconductor wafer layers and semiconductor component linearity.

The semiconductor fabrication processing device may derive 1506 an alignment correction based on the alignment information to properly position semiconductor components across two or more semiconductor wafer layers. Alternatively, the semiconductor fabrication processing device may determine that semiconductor components are excessively misaligned, and that a semiconductor wafer may not be useable.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A semiconductor wafer comprising:
   a first layer metrology target, the first layer metrology target comprising a plurality of first layer pattern elements, the plurality of first layer pattern elements defining a first pitch, and each first layer patterns element having a distinct width as compared to every other first layer pattern element; and
   a second layer metrology target, the second layer metrology target comprising a plurality of second layer pattern elements having substantially identical widths, the plurality of second layer pattern elements organized into a plurality of second layer target structures, a first target structure comprising a plurality of pattern elements defining the first pitch, and a second target structure comprising a plurality of pattern elements defining both the first pitch and the second pitch, each of the plurality of second layer target structures configured to align to a corresponding first layer pattern element such that successive second layer target structures are offset from their corresponding first layer pattern elements by progressively increasing distances,
   wherein the first layer metrology target and the second layer metrology target are configured to measure linearity.

2. The semiconductor wafer of claim 1, wherein:
   the first pitch is configured to facilitate fabrication of at least a first integrated circuit component; and
   each distinct pitch is configured to facilitate fabrication of at least a second integrated circuit component.

3. The semiconductor wafer of claim 1, wherein the first layer metrology target comprises a plurality of first layer pattern elements, the plurality of first layer pattern elements configured with a fixed pitch between adjacent first layer pattern elements, said fixed pitch corresponding to the first pitch.

4. The semiconductor wafer of claim 3, wherein:
   each of the plurality of second layer pattern structures corresponds to a first layer pattern element.

5. The semiconductor wafer of claim 1, wherein the plurality of the second layer pattern structures is further configured with at least two different coverage ratios.

6. The semiconductor wafer of claim 1, wherein:
   a first pattern structure and a second pattern structure of the plurality of second layer pattern structure are configured to define the first pitch and are each configured with a first coverage ratio such that the first pattern structure and the second pattern structure define a first average coverage ratio;
   a third pattern structure further defines the first pitch with relation to the first pattern structure and the second pattern structure, the second layer pattern elements comprising the third pattern structure define a second pitch, and the third pattern structure defines a second average coverage ratio.

7. A semiconductor fabrication apparatus comprising:
   a processor;
   a metrology target sensing device connected to the processor;
   memory connected to the processor; and
   computer executable program code stored in the memory, wherein the computer executable program code is configured to:
   detect a first layer metrology target comprising a plurality of first layer pattern elements defining a first pitch and each first layer patterns element having a distinct width as compared to every other first layer pattern element;
   detect a second layer metrology target comprising a plurality of second layer pattern structures, the plurality of second layer pattern structures also defining the first pitch, each of the second layer pattern structures comprising a plurality of pattern structure elements having substantially identical widths, wherein each of the second layer pattern structures defines a distinct pitch as compared to each other second layer pattern structure and the first pitch, and the second layer metrology target orthogonal to the first layer metrology target, each of the plurality of second layer target structures configured to align to a corresponding first layer pattern element such that successive second layer target structures are offset from their corresponding first layer pattern elements by progressively increasing distances; and
   derive alignment information pertaining to two or more integrated circuit components in a first layer on a semiconductor wafer relative to two or more integrated circuit components in a second layer on a semiconductor wafer based on a linearity between the plurality of first layer pattern elements and the plurality of second layer pattern structures.

8. The semiconductor fabrication of claim 7, wherein the first layer metrology target comprises a plurality of first layer pattern elements, the plurality of first layer pattern elements configured with a fixed pitch between adjacent first layer pattern elements, said fixed pitch corresponding to the first pitch.

9. The semiconductor fabrication of claim 7, wherein:
   the first layer metrology target comprises a plurality of first layer pattern elements; and
   each of the plurality of second layer pattern structures is configured to align with a corresponding first layer pattern element.

10. The semiconductor fabrication of claim 7, wherein at least two of the plurality of second layer pattern structures is further configured with different coverage ratios.

11. The semiconductor fabrication of claim 7, wherein:
   a first pattern structure and a second pattern structure of the plurality of second layer pattern structure are configured to define the first pitch and are each configured with a first coverage ratio such that the first pattern structure and the second pattern structure define a first average coverage ratio;
   a third pattern structure further defines the first pitch with relation to the first pattern structure and the second pattern structure, the second layer pattern elements comprising the third pattern structure define a second pitch, and the third pattern structure defines a second average coverage ratio.

12. A method for aligning elements in separate semiconductor layers, comprising:
- detecting, with a metrology detecting element connected to a processing element, a first layer metrology target comprising a plurality of first layer pattern elements, at least one set of first layer pattern elements defining a first pitch and each first layer patterns element having a distinct width as compared to every other first layer pattern element;
- detecting, with a metrology detecting element connected to a processing element, a second layer metrology target comprising a plurality of second layer pattern structures, each of the plurality of second layer pattern structures configured to align to a corresponding first layer pattern element such that successive second layer pattern structures are offset from their corresponding first layer pattern elements by progressively increasing distances, each of the plurality of pattern structures comprising a plurality of pattern structure elements having substantially identical widths, the pattern structure elements of each second layer pattern structure defining a distinct pitch as compared to the other second layer pattern structures and the first pitch, and the second layer metrology target orthogonal to the first layer metrology target; and
- deriving, with a processing element, alignment information pertaining to two or more integrated circuit components in a first layer on a semiconductor wafer relative to two or more integrated circuit components in a second layer on a semiconductor wafer based on a linearity between the plurality of first layer pattern elements and the plurality of second layer pattern structures.

13. The method of claim 12, wherein the first layer metrology target comprises a plurality of first layer pattern elements, the plurality of first layer pattern elements configured with a fixed pitch between adjacent first layer pattern elements, said fixed pitch corresponding to the first pitch.

14. The method of claim 12, wherein:
- the first layer metrology target comprises a plurality of first layer pattern elements; and
- each of the plurality of second layer pattern structures is configured to align with a corresponding first layer pattern element.

15. The method of claim 12, wherein the plurality of second layer pattern structures is further configured with at least two different coverage ratios.

16. The method of claim 12, wherein:
- a first pattern structure and a second pattern structure of the plurality of second layer pattern structure are configured to define the first pitch and are each configured with a first coverage ratio such that the first pattern structure and the second pattern structure define a first average coverage ratio;
- a third pattern structure further defines the first pitch with relation to the first pattern structure and the second pattern structure, the second layer pattern elements comprising the third pattern structure define a second pitch, and the third pattern structure defines a second average coverage ratio.

17. The semiconductor wafer of claim 1, wherein:
- the first layer metrology target comprises at least two first layer target structures in a first row; and
- the second layer metrology target comprises at least one second layer target structure in the first row and at least two second layer target structures in a first column.

18. The semiconductor fabrication apparatus of claim 7, wherein:
- the first layer metrology target comprises at least two first layer target structures in a first row; and
- the second layer metrology target comprises at least one second layer target structure in the first row and at least two second layer target structures in a first column.

* * * * *